(12) United States Patent
Wang et al.

(10) Patent No.: US 12,375,787 B2
(45) Date of Patent: Jul. 29, 2025

(54) DRIVING MECHANISM

(71) Applicant: TDK TAIWAN CORP., Taoyuan (TW)

(72) Inventors: Ying-Jen Wang, Taoyuan (TW); Ya-Hsiu Wu, Taoyuan (TW); Yi-Ho Chen, Taoyuan (TW); Chao-Chang Hu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 581 days.

(21) Appl. No.: 17/836,509

(22) Filed: Jun. 9, 2022

(65) Prior Publication Data

US 2022/0397804 A1    Dec. 15, 2022

Related U.S. Application Data

(60) Provisional application No. 63/209,750, filed on Jun. 11, 2021.

(51) Int. Cl.
| | |
|---|---|
| *H04N 23/54* | (2023.01) |
| *G01D 5/20* | (2006.01) |
| *G02B 7/02* | (2021.01) |
| *G02B 7/04* | (2021.01) |
| *G02B 7/18* | (2021.01) |
| *G03B 13/34* | (2021.01) |
| *H01F 7/08* | (2006.01) |
| *H01F 27/28* | (2006.01) |
| *H02K 41/02* | (2006.01) |
| *H04N 23/55* | (2023.01) |
| *H04N 23/57* | (2023.01) |
| *H10N 30/20* | (2023.01) |
| *H10N 30/88* | (2023.01) |

(52) U.S. Cl.
CPC ........... *H04N 23/54* (2023.01); *G01D 5/2046* (2013.01); *G02B 7/022* (2013.01); *G02B 7/023* (2013.01); *G02B 7/1805* (2013.01); *G03B 13/34* (2013.01); *H01F 7/081* (2013.01); *H01F 27/28* (2013.01); *H02K 41/02* (2013.01); *H04N 23/55* (2023.01); *H04N 23/57* (2023.01); *H10N 30/202* (2023.02); *H10N 30/88* (2023.02); *G02B 7/04* (2013.01); *H01F 2007/086* (2013.01)

(58) Field of Classification Search
None
See application file for complete search history.

(56) References Cited

U.S. PATENT DOCUMENTS

| | | | |
|---|---|---|---|
| 2015/0212291 A1* | 7/2015 | Lee | H04N 23/687 348/360 |
| 2020/0041872 A1* | 2/2020 | Köpfer | G03B 17/02 |
| 2024/0276088 A1* | 8/2024 | Wei | H04N 23/687 |

* cited by examiner

*Primary Examiner* — Shan Liu
(74) *Attorney, Agent, or Firm* — MUNCY, GEISSLER, OLDS & LOWE, P.C.

(57) ABSTRACT

A driving mechanism is provided, including a fixed part, a movable part connected to the fixed part, a first connecting member, and a first wire. The first connecting member is hinged to the fixed part and connected to the movable part. The first wire has SMA material and is connected between the fixed part and the first connecting member. When the first wire contracts in length, the first connecting member rotates relative to the fixed part, and the movable part is driven to move relative to the fixed part.

19 Claims, 12 Drawing Sheets

DRIVING MECHANISM

CROSS REFERENCE TO RELATED APPLICATIONS

This application claims priority of provisional U.S. Patent Application Ser. No. 63/209,750, filed on Jun. 11, 2021, the entirety of which is incorporated by reference herein.

BACKGROUND OF THE INVENTION

Field of the Invention

The application relates in general to a driving mechanism, and in particular, to a driving mechanism for moving an optical element.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

In some electronic devices, several coils and magnets are usually used for adjusting the focus of a lens. However, miniaturization of the electronic devices may increase the difficulty of mechanical design, and it may also lead to low reliability and a low driving force for moving the lens. Therefore, addressing the aforementioned problems has become a challenge.

BRIEF SUMMARY OF INVENTION

In view of the aforementioned problems, the object of the invention is to provide a driving mechanism for moving an optical element. The driving mechanism includes a driving mechanism, including a fixed part, a movable part, a first connecting member, a hinge, and a first wire. The movable part is connected to the fixed part, wherein the optical element is disposed on the movable part. The first connecting member has a free end and a connection end connected to the movable part. The hinge pivotally connects the first connecting member to the fixed part. The first wire has Shape Memory Alloy (SMA) material and connects the free end to the fixed part. When the first wire contracts in length, the first connecting member is forced to rotate relative to the fixed part around the hinge, and the movable part is forced to move relative to the fixed part in a first direction.

In some embodiments, the distance between the first wire and the hinge is shorter than the distance between the connection end and the hinge.

In some embodiments, the first connecting member and the hinge has metal material, and the first wire is electrically connected to a circuit structure on the bottom plate via the first connecting member and the hinge.

In some embodiments, the driving mechanism further includes a shaft extending through the movable part and connecting to the fixed part, wherein when the first wire contracts in length, the first connecting member rotates relative to the fixed part and forces the movable part to slide along the shaft.

In some embodiments, the shaft is parallel to an optical axis of the optical element.

In some embodiments, the first wire is located between the hinge and the connection end along the first axis.

In some embodiments, the first wire is located between the hinge and the shaft along the first axis.

In some embodiments, the first connecting member further has a pivot portion for receiving the hinge, a resistance arm connected between the pivot portion and the connection end, and an effort arm connected between the pivot portion and the free end, wherein the resistance arm is longer than the effort arm.

In some embodiments, the resistance arm has a C-shaped or U-shaped structure.

In some embodiments, the resistance arm forms a hole, and an optical axis of the optical element extends through the hole.

In some embodiments, the driving mechanism further includes a second connecting member and a second wire, wherein the second connecting member is hinged on the fixed part, and the second wire has Shape Memory Alloy (SMA) material and connects the second connecting member to the fixed part, wherein when the second wire contracts in length, the second connecting member is forced to rotate relative to the fixed part, and the movable part is forced to move relative to the fixed part in a second direction opposite to the first direction.

In some embodiments, when viewed along a second axis that is perpendicular to an optical axis of the optical element, the first and second connecting members partially overlap.

In some embodiments, the movable part includes a first slider and a second slider, and the driving mechanism further includes a third wire connecting to the first and second sliders, wherein when the third wire contracts in length, the first slider is forced to move relative to the second slider.

In some embodiments, the driving mechanism further includes two third wires connected between the first and second sliders for driving the first slider to move relative to the second slider either in the first direction or in the second direction.

In some embodiments, the driving mechanism further includes a circuit unit disposed on the fixed part, and the circuit unit has a base portion, a side portion, and a bent portion, wherein the base portion is connected to the fixed part, the side portion connects the base portion to the bent portion, and the side portion and the bent portion are perpendicular to the base portion.

In some embodiments, the bent portion has an L-shaped structure connected between the side portion and the movable part.

In some embodiments, the driving mechanism further includes a magnet disposed on the movable part and a Hall effect sensor disposed on the base portion of the circuit unit for sensing the magnet.

In some embodiments, the bent portion contacts a conductive terminal on the movable part for electrically connecting to the first wire.

In some embodiments, an opening is formed between the base portion and the side portion, and the hinge extends through the opening.

In some embodiments, the driving mechanism further includes a circuit unit disposed on the fixed part, and the circuit unit has an outer frame, an inner frame, and a plurality of rods connected between the outer and inner frames, wherein the outer frame is connected to the fixed part, and the inner frame contacts a conductive terminal on the movable part for electrically connecting to the first wire.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
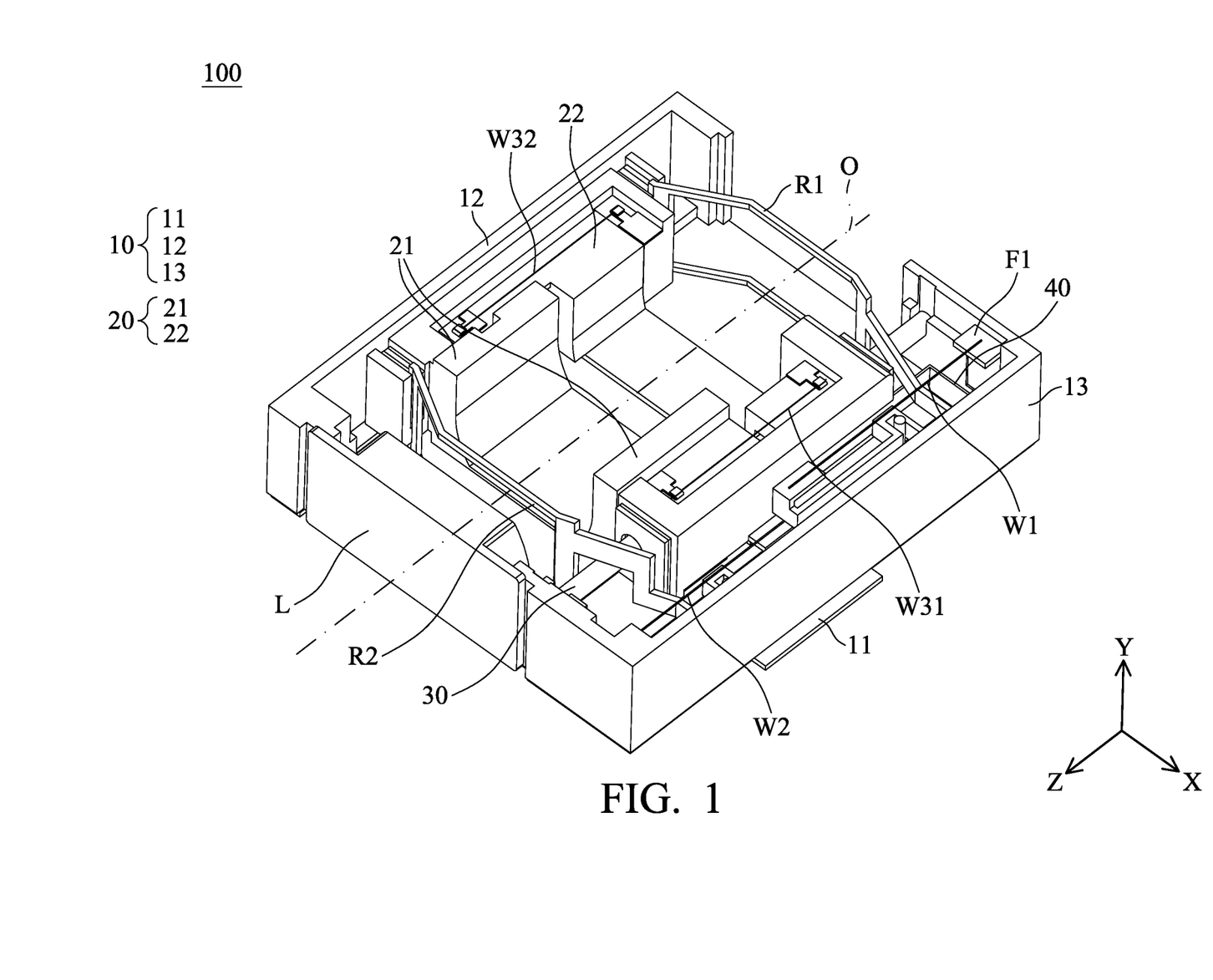
FIG. 1 is a perspective diagram of a driving mechanism 100 in accordance with an embodiment of the invention.
Figure 2:
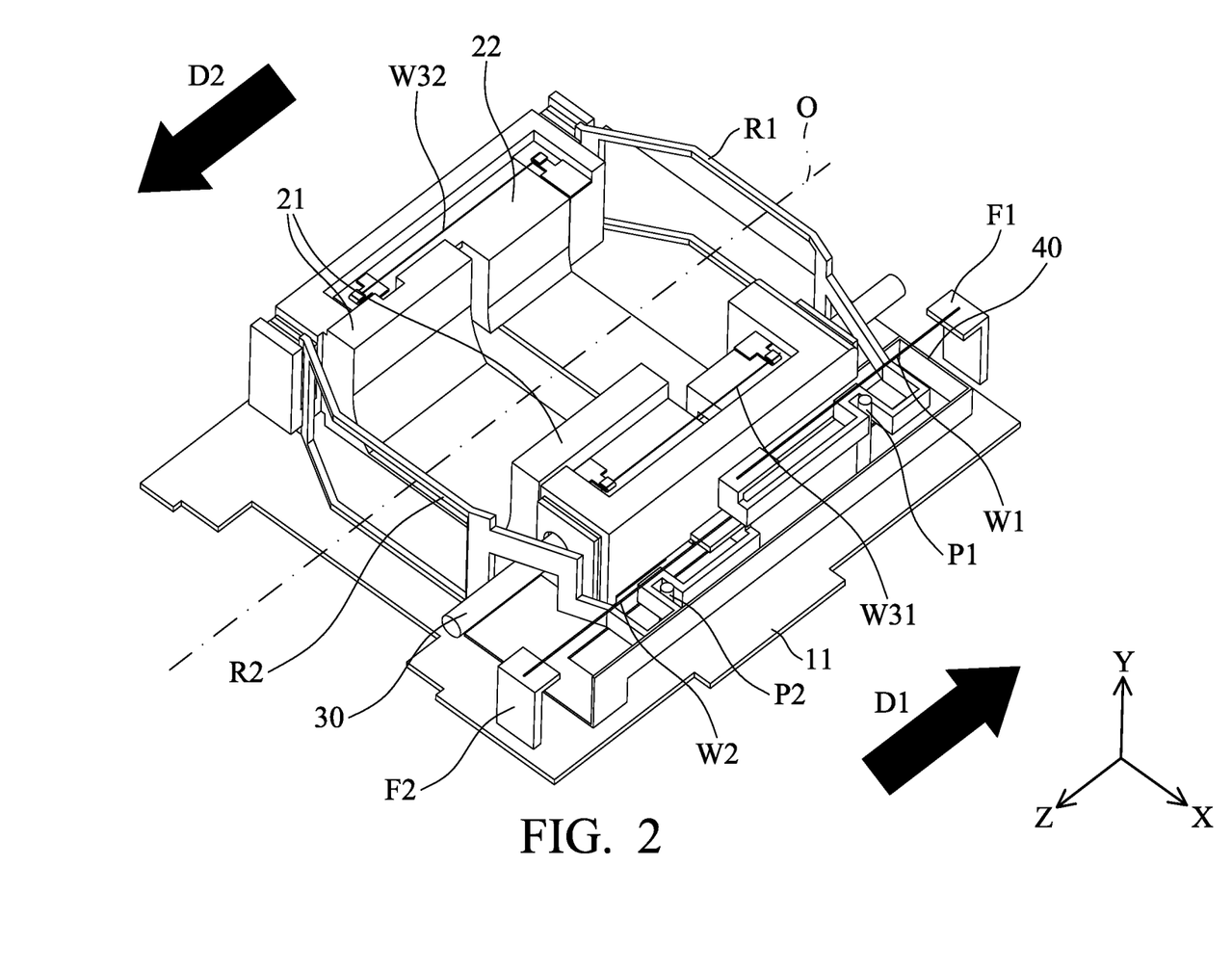
FIG. 2 is a perspective diagram of the driving mechanism 100 in FIG. 1 with the lens L and the sidewalls 12 and 13 omitted therefrom.
Figure 3:
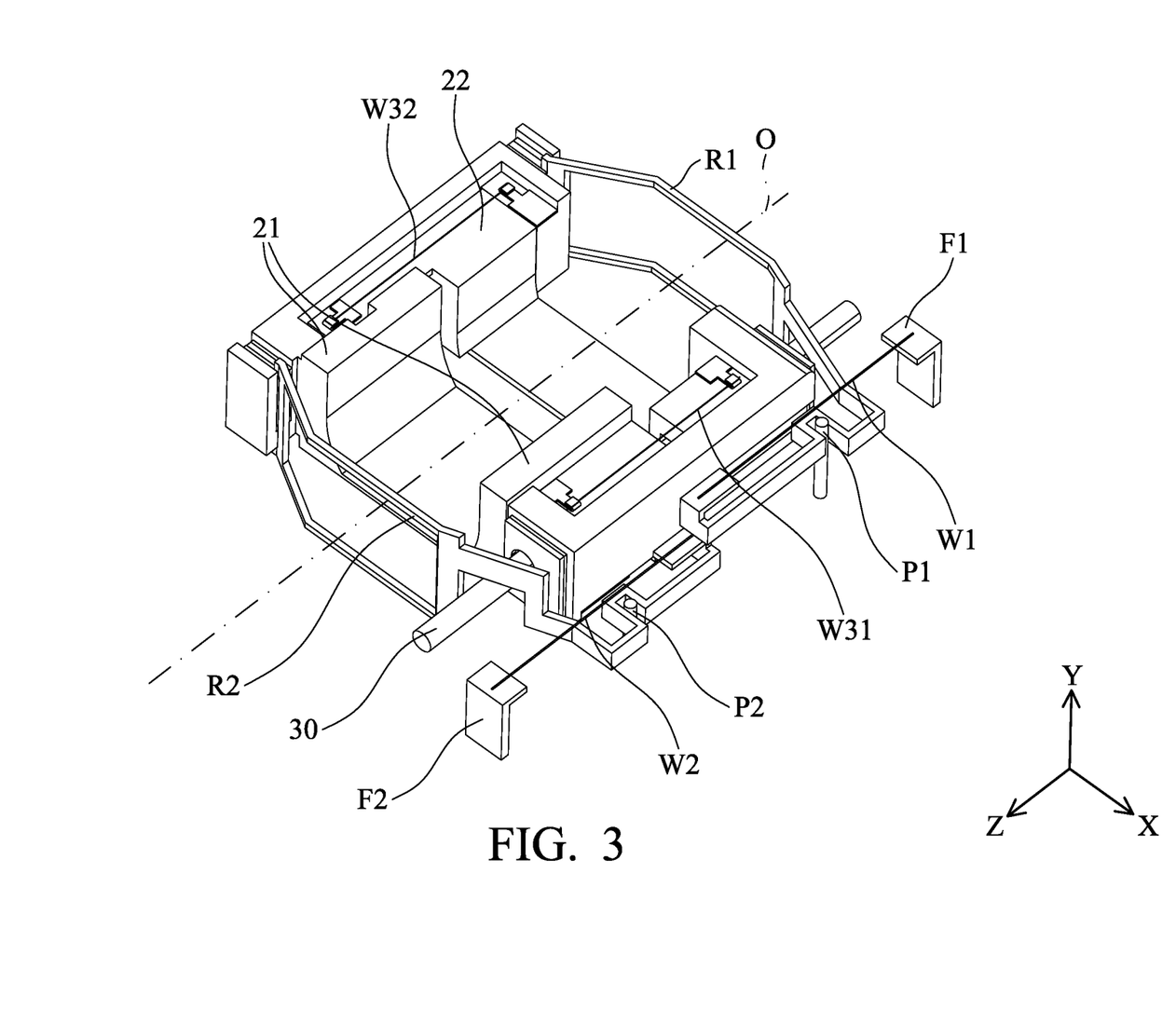
FIGS. 3 and 4 are perspective diagrams of the driving mechanism 100 in FIG. 1 with the lens L, the fixed part 10, and the circuit unit 40 omitted therefrom.
Figure 4:
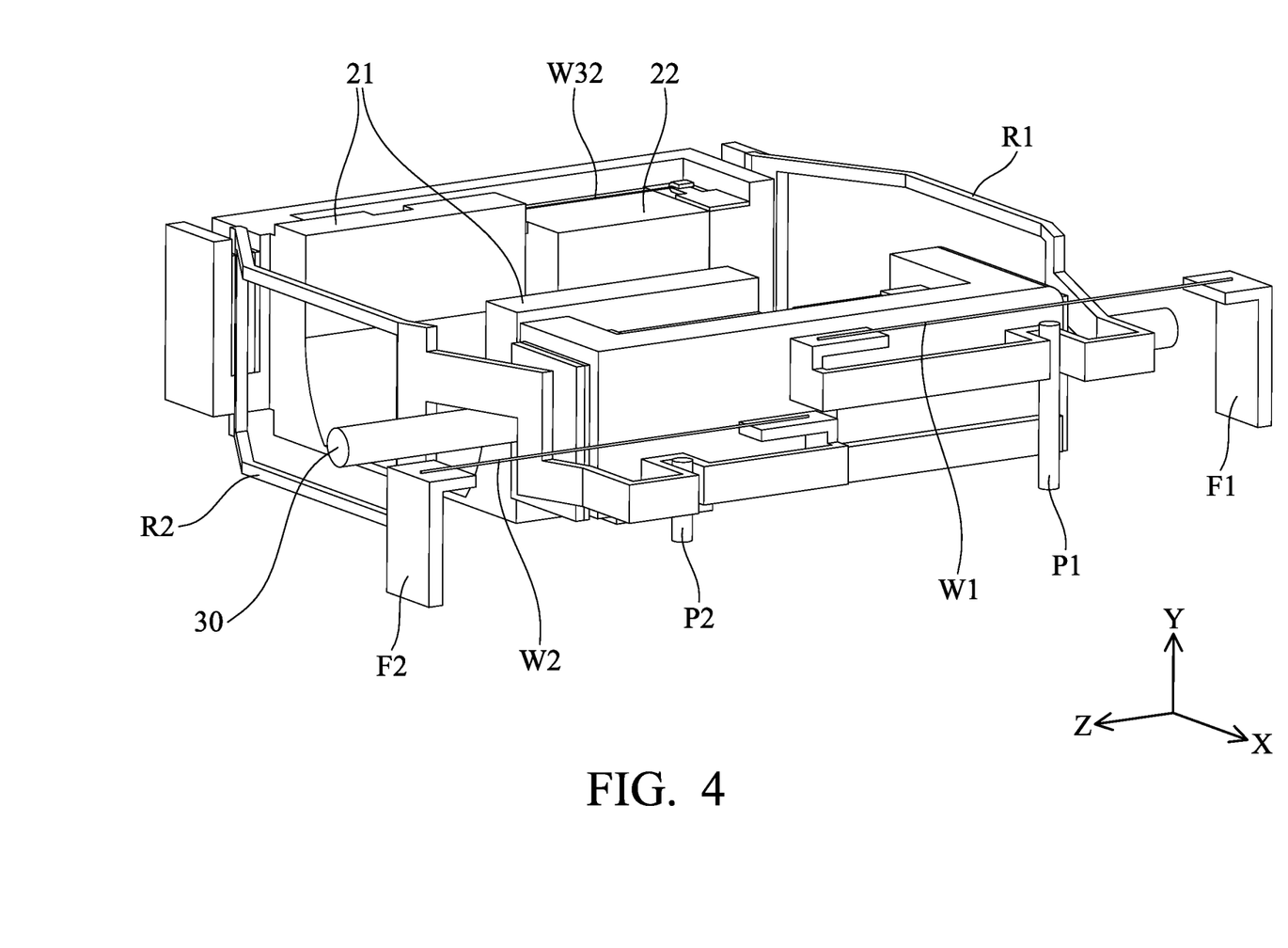

FIG. 1 is a perspective diagram of a driving mechanism 100 in accordance with an embodiment of the invention. FIG. 2 is a perspective diagram of the driving mechanism 100 in FIG. 1 with the lens L and the sidewalls 12 and 13 omitted therefrom. FIGS. 3 and 4 are perspective diagrams of the driving mechanism 100 in FIG. 1 with the lens L, the fixed part 10, and the circuit unit 40 omitted therefrom.

Referring to FIGS. 1-4, the driving mechanism 100 in this embodiment may be disposed in a camera device, and it primarily includes a fixed part 10, a movable part 20, a shaft 30, a circuit unit 40, a first connecting member R1, a second connecting member R2, a first wire W1, a second wire W2, and two third wires W31 and W32. The first and second connecting members R1 and R2 have an L-shaped structure, and the first, second, and third wires W1, W2, W31, and W32 comprise Shape Memory Alloy (SMA) material.

In this embodiment, the fixed part 10 has a bottom plate 11 and two sidewalls 12 and 13 extending from the bottom plate 11 in the Y direction. The circuit unit 40 is affixed to the bottom plate 11 and/or the sidewall 13 for electrically connecting to the first and second wires W1 and W2. Additionally, the movable part 20 includes a first slider 21 and a second slider 22. The shaft 30 extends through the first and second sliders 21 and 22 and is affixed to opposite ends of the sidewall 13. Hence, the movable part 20 can be guided by the shaft 30 to slide relative to the fixed part 10 along the Z axis.

As shown in FIGS. 1-4, a lens L is disposed at an end of the fixed part 10. The lens L, the first slider 21, and the second slider 22 are arranged along the Z axis. In this embodiment, one or several optical elements (not shown) may be disposed on the first and second sliders 21 and 22, and the optical axis 0 of these optical elements (e.g. optical lenses) extends through the lens L.

It should be noted that the first and second connecting members R1 and R2 are hinged on the bottom plate 11 via the hinges P1 and P2 (FIG. 2), and the ends of the first and second connecting members R1 and R2 are affixed to opposite sides of the first slider 21. Moreover, two metal parts F1 and F2 are affixed to opposite ends of the sidewall 13, wherein the first wire W1 is connected between the metal part F1 and the first connecting member R1, and the second wire W2 is connected between the metal part F2 and the second connecting member R2.

When a current signal is applied to the first wire W1, the first wire W1 contracts in length and forces the first slider 21 to move relative to the fixed part 10 in the −Z direction (the first direction D1) via the first connecting member R1. In contrast, when a current signal is applied to the second wire W2, the second wire W2 contracts in length and forces the first slider 21 to move relative to the fixed part 10 in the Z direction (the second direction D2) via the second connecting member R2.

Additionally, the two third wires W31 and W32 are connected between the first slider 21 and the second slider 22 that is movably received in the first slider 21. When a current signal is applied to the third wire W31, the third wire W31 contracts in length and forces the second slider 22 to move relative to the first slider 21 in the Z direction (the second direction D2). In contrast, when a current signal is applied to the third wire W32, the third wire W32 contracts in length and forces the second slider 22 to move relative to the first slider 21 in the −Z direction (the first direction D1).

Figure 5:
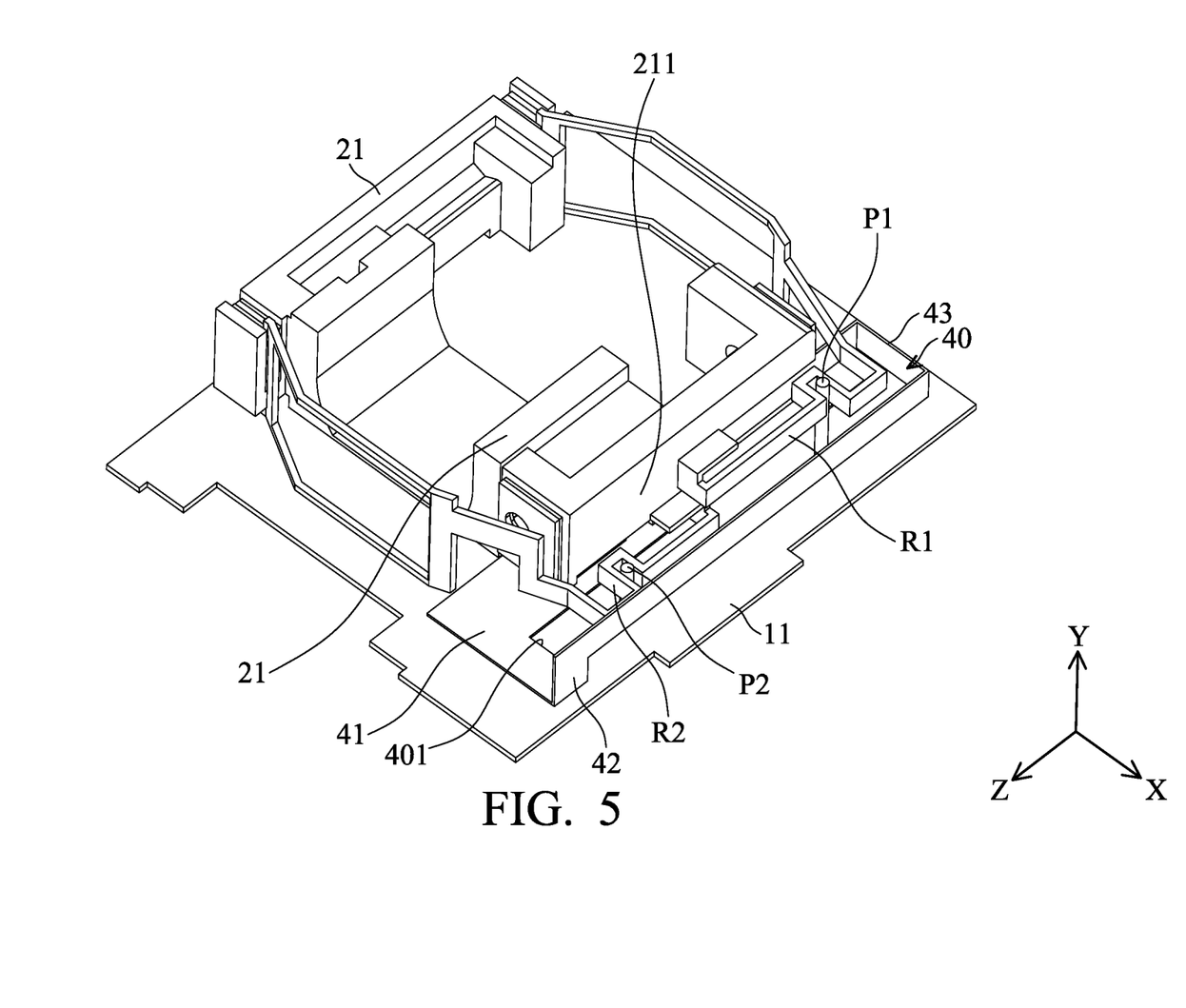
FIG. 5 is a perspective diagram of the bottom plate 11, the circuit unit 40, the first slider 21, the first and second connecting members R1 and R2, and the hinges P1 and P2 in FIG. 1.
Figure 6:
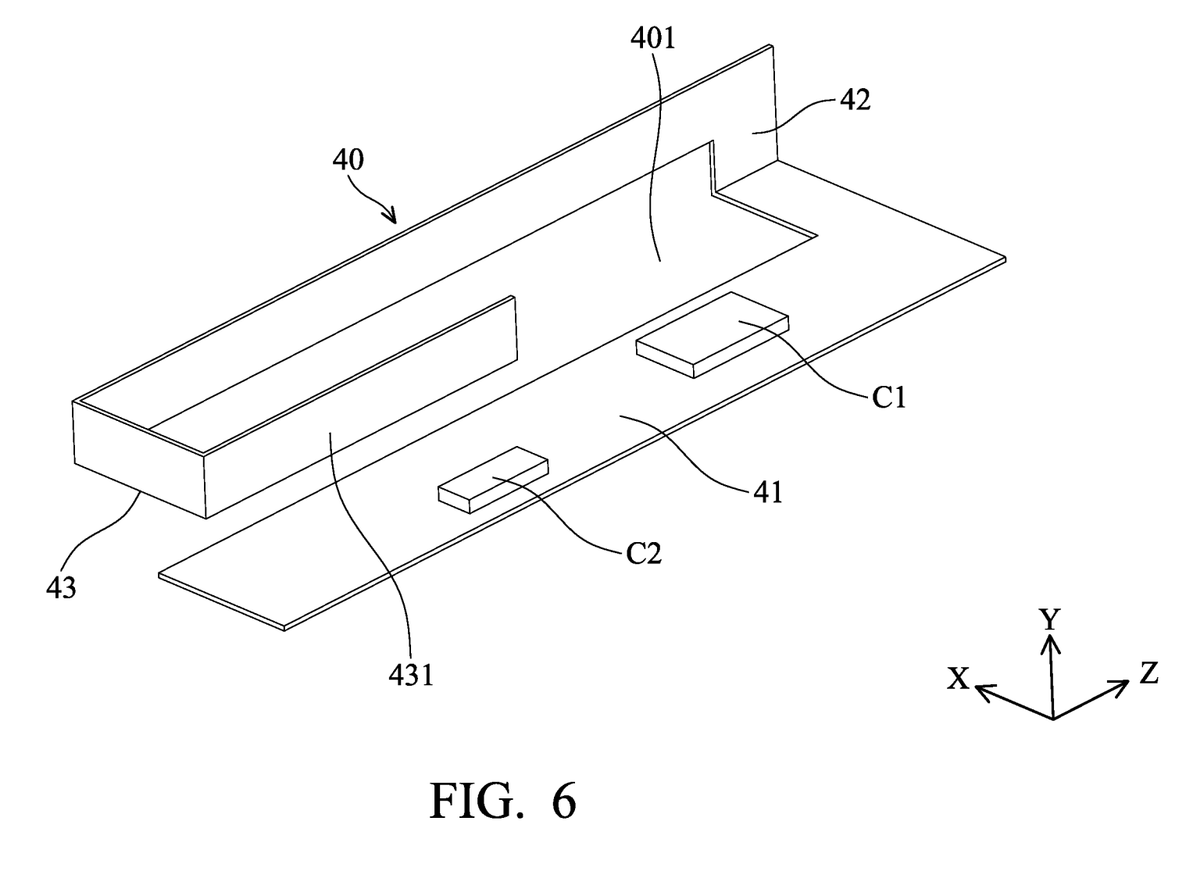
FIG. 6 is a perspective diagram of the circuit unit 40 in FIG. 5.

FIG. 5 is a perspective diagram of the bottom plate 11, the circuit unit 40, the first slider 21, the first and second connecting members R1 and R2, and the hinges P1 and P2 in FIG. 1. FIG. 6 is a perspective diagram of the circuit unit 40 in FIG. 5.

As shown in FIGS. 5 and 6, the circuit unit 40 in this embodiment may comprise a PCB, FPC or other circuit structure produced by insert molding or LDS technology. The circuit unit 40 primarily has an L-shaped base portion 41, an L-shaped side portion 42, and an L-shaped bent portion 43 connected between the side portion 42 and the first slider 21.

In this embodiment, the base portion 41 is affixed to the bottom plate 11, and the side portion 42 is connected between the base portion 41 and the bent portion 43, wherein the side portion 42 and the bent portion 43 are perpendicular to the base portion 41. Referring to FIG. 6, two IC elements C1 and C2 are disposed on the base portion 41.

The bent portion 43 has a surface 431 in contact with a conductive terminal on the lateral side 211 of the first slider 21 (FIG. 5). When the first slider 21 slides along the Z axis relative to the bottom plate 11, the surface 431 remains in contact with the conductive terminal.

Therefore, the third wires W31 and W32 can be electrically connected to the IC elements C1 and C2 on the base portion 41 of the circuit unit 40 through the metal traces embedded in the first slider 21 and the conductive terminals on the lateral side 211. The circuit unit 40 can be further connected to an external circuit through the circuit structure (not shown) formed on the bottom plate 11.

Still referring to FIGS. 5 and 6, an opening 401 is formed between the base portion 41 and the side portion 42, and the hinges P1 and P2 extend through the opening 401 and connect to the bottom plate 11. Hence, the first and second connecting members R1 and R2 can be pivotally connected to the bottom plate 11 via the hinges P1 and P2.

Figure 7:
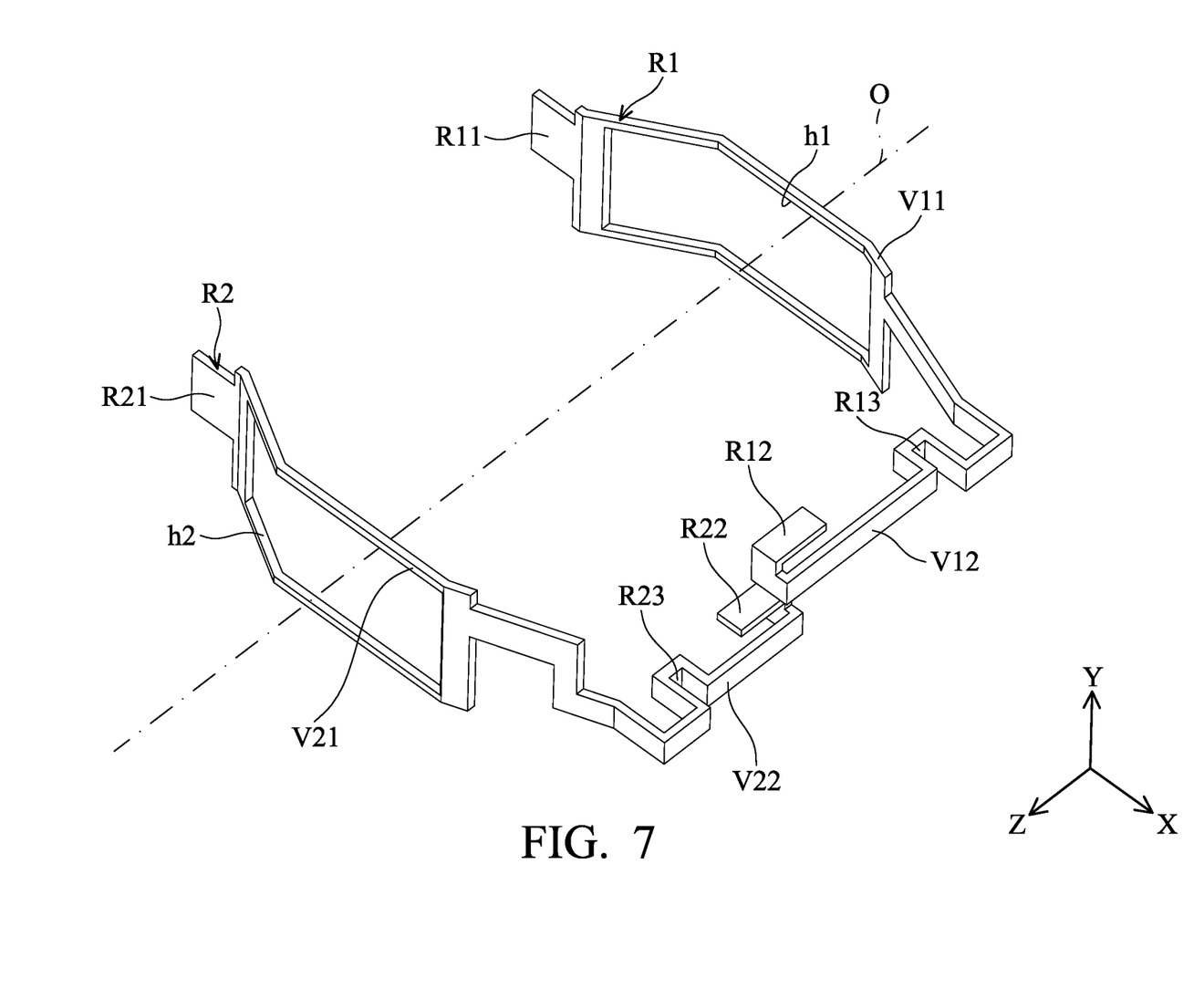
FIG. 7 is a perspective diagram of the first and second connecting members R1 and R2.
Figure 8:
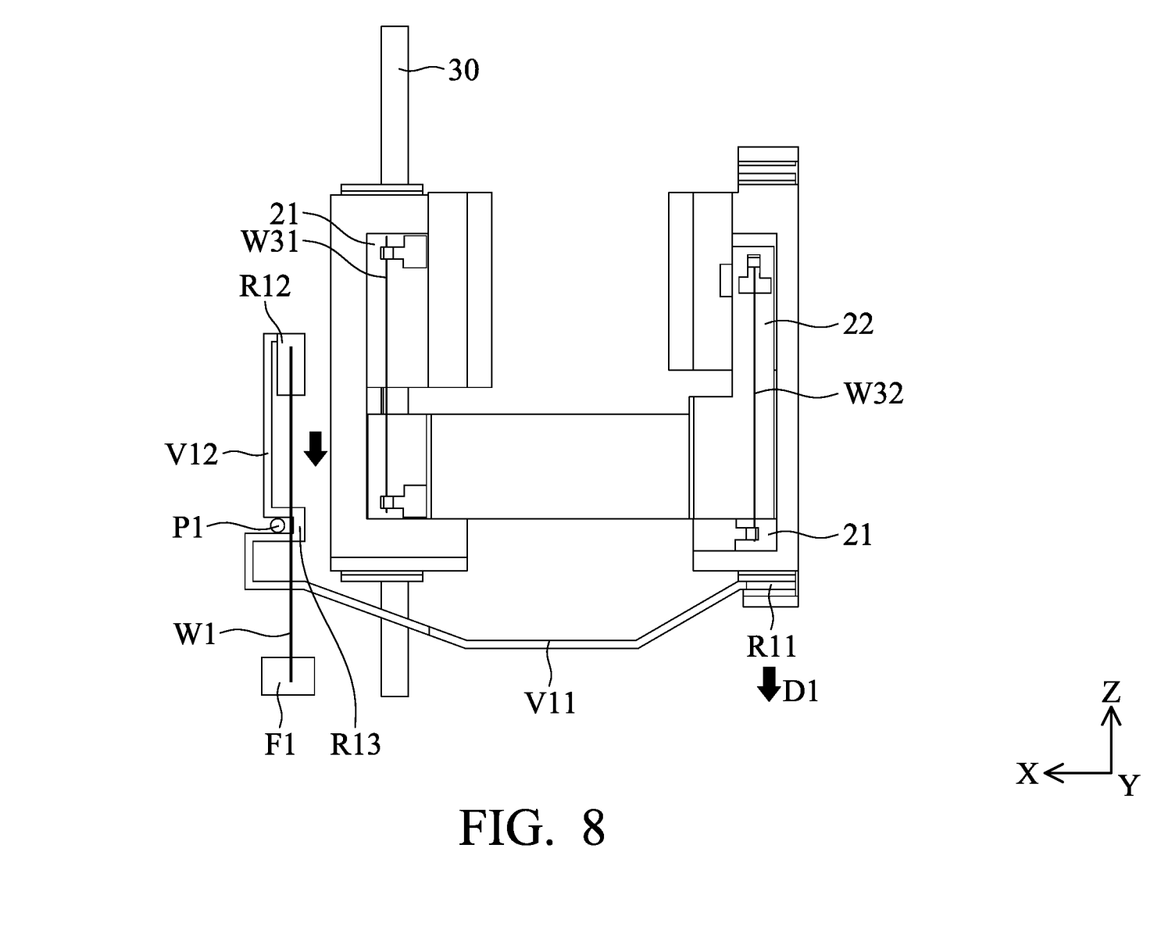
FIG. 8 is a top view showing the first connecting member R1 impels the first slider 21 in the −Z direction (the first direction D1) relative to the fixed part 10 when the first wire W1 contracts in length.
Figure 9:
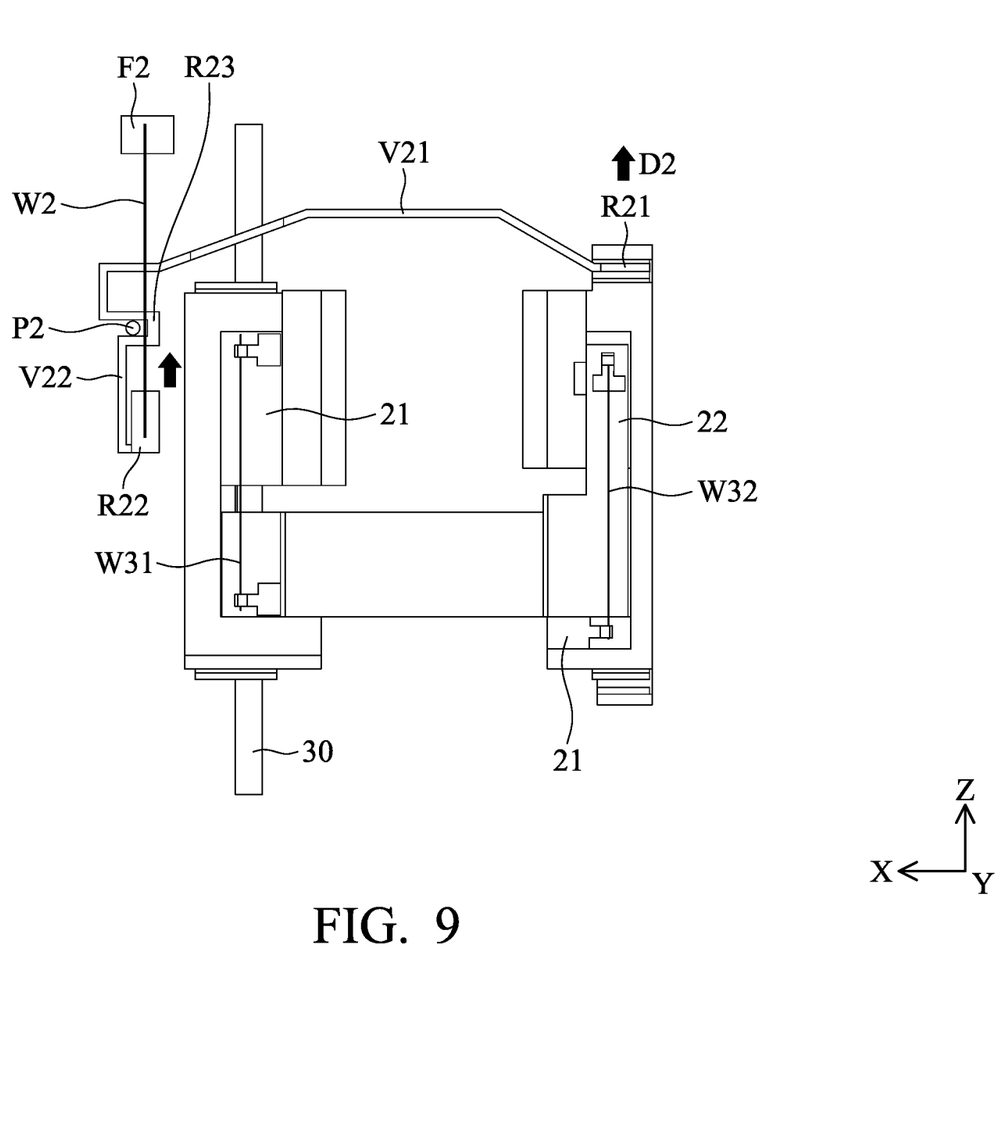
FIG. 9 is a top view showing the second connecting member R2 impels the first slider 21 in the Z direction (the second direction D2) relative to the fixed part 10 when the second wire W2 contracts in length.

FIG. 7 is a perspective diagram of the first and second connecting members R1 and R2. FIG. 8 is a top view showing the first connecting member R1 impels the first slider 21 in the −Z direction (the first direction D1) relative to the fixed part 10 when the first wire W1 contracts in length. FIG. 9 is a top view showing the second connecting member R2 impels the first slider 21 in the Z direction (the second direction D2) relative to the fixed part 10 when the second wire W2 contracts in length.

As shown in FIGS. 7-9, the first connecting member R1 has a connection end R11, a free end R12, a U-shaped pivot portion R13, a resistance arm V11, and an effort arm V12. The resistance arm V11 has a bent structure connecting the pivot portion R13 to the connection end R11. The effort arm V12 connects the pivot portion R13 to the free end R12, and the resistance arm V11 is longer than the effort arm V12.

Similarly, the second connecting member R2 has a connection end R21, a free end R22, a U-shaped pivot portion R23, a resistance arm V21 and an effort arm V22. The resistance arm V21 has a bent structure connecting the pivot portion R23 to the connection end R21. The effort arm V22 connects the pivot portion R23 to the free end R22, and the resistance arm V21 is longer than the effort arm V22.

Specifically, the resistance arm V11 forms a hole h1, and the resistance arm V21 forms a hole h2, thereby increasing the flexibility and reducing the weight of the resistance arms V11 and V21. Moreover, the optical axis O of the optical elements extends through the holes h1 and h2, so that light would not be blocked by the resistance arms V11 and V21. In some embodiments, the resistance arms V11 and V21 may have a C-shaped or U-shaped structure, so that the resistance arms V11 and V21 can be longer than the distance from the connection ends R11, R21 to the hinges P1, P2 along the X axis. Thus, the moving distance of the first slider 21 can be increased, and the resistance arms V11 and V21 can be more resilient to increase structural reliability of the first and second connecting members R1 and R2.

In FIGS. 7 and 8, the connection end R11 is affixed to a first end of the first slider 21, and the hinge P1 is received in the pivot portion R13. The two ends of the first wire W1 are respectively mounted on the free end R12 and the metal part F1 by soldering or welding, wherein the distance between the first wire W1 and the hinge P1 is shorter than the distance between the connection end R11 and the hinge P1.

When a current signal is applied to the first wire W1, the first wire W1 contracts in length and forces the first connecting member R1 to rotate clockwise around the hinge P1. Hence, the first slider 21 can be forced to move relative to the fixed part 10 in the −Z direction (the first direction D1) by the first connecting member R1, as indicated by the arrow in FIG. 8.

Similarly, as shown in FIGS. 7 and 9, the connection end R21 is affixed to a second end of the first slider 21 (opposite to the first end), and the hinge P2 is received in the pivot portion R23. The two ends of the second wire W2 are respectively mounted on the free end R22 and the metal part F2 by soldering or welding, wherein the distance between the second wire W2 and the hinge P2 is shorter than the distance between the connection end R21 and the hinge P2.

When a current signal is applied to the second wire W2, the second wire W2 contracts in length and forces the second connecting member R2 to rotate counterclockwise around the hinge P2. Hence, the first slider 21 can be forced to move relative to the fixed part 10 in the Z direction (the second direction D2) by the second connecting member R2, as indicated by the arrow in FIG. 9.

In this embodiment, the first and second connecting members R1 and R2 are disposed on opposite sides of the first slider 21. When the first wire W1 or the second wire W2 contracts, the first slider 21 can be impelled either in the −Z direction or in the Z direction by the first and second connecting members R1 and R2, thereby achieving rapid and accurate positioning of the first slider 21.

It should be noted that the first and second wires W1 and W2 are located between the hinge P1, P2 and the shaft 30 along the X axis (the first axis), thus achieving effective space utilization of the driving mechanism 100 and facilitating miniaturization of the product.

For example, the first and second connecting members R1, R2 and the hinges P1, P2 may comprise metal, whereby the first and second wires W1 and W2 can be electrically connected to the circuit structure on the bottom plate 11 via the first and second connecting members R1, R2 and the hinges P1, P2

In this embodiment, the shaft 30 is parallel to the axis O and located between the hinges P1, P2 and the connection ends R11, R21 along the X axis (the first axis). Moreover, when viewed along the Y axis (the second axis) that is perpendicular to the optical axis O of the optical elements, the first and second connecting members R1 and R2 partially overlap, thereby achieving effective space utilization of the driving mechanism 100 and facilitating miniaturization of the product.

Figure 10:
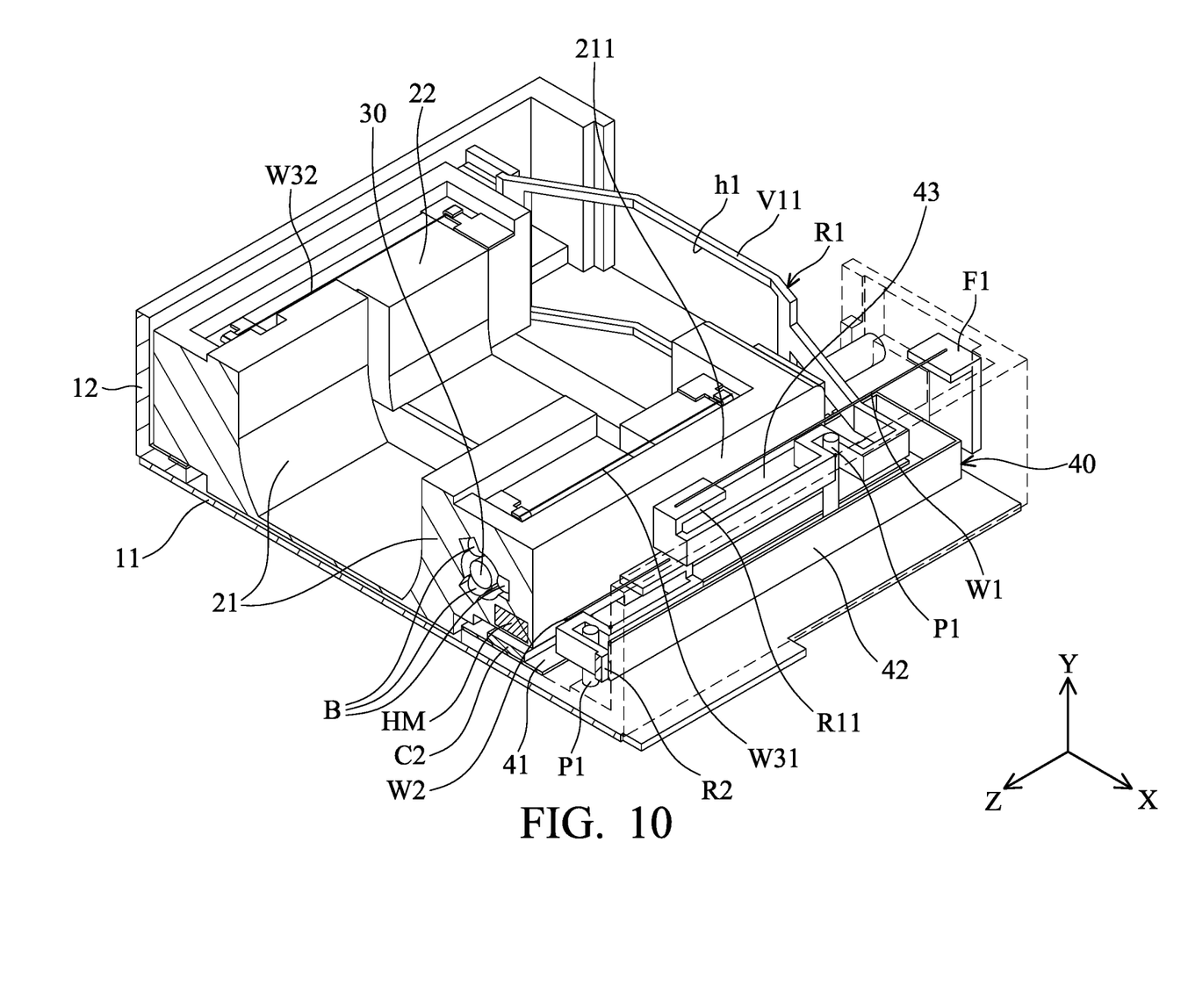
FIG. 10 is a cross-sectional view of the driving mechanism 100 in FIG. 1.

FIG. 10 is a cross-sectional view of the driving mechanism 100 in FIG. 1. As shown in FIG. 10, the shaft 30 extends through a hole of the first slider 21. Several rollers B are disposed in the hole and connected between the shaft 30 and the first slider 21, thereby improving the stability of the first slider 21 when sliding along the shaft 30.

Still referring to FIG. 10, a magnet HM is disposed at the bottom of the first slider 21, and the IC element C2 (e.g. Hall effect sensor) on the base portion 41 of the circuit unit 40 can detect the magnet HM, whereby the displacement of the first slider 21 relative to the bottom plate 11 can be determined.

Figure 11:
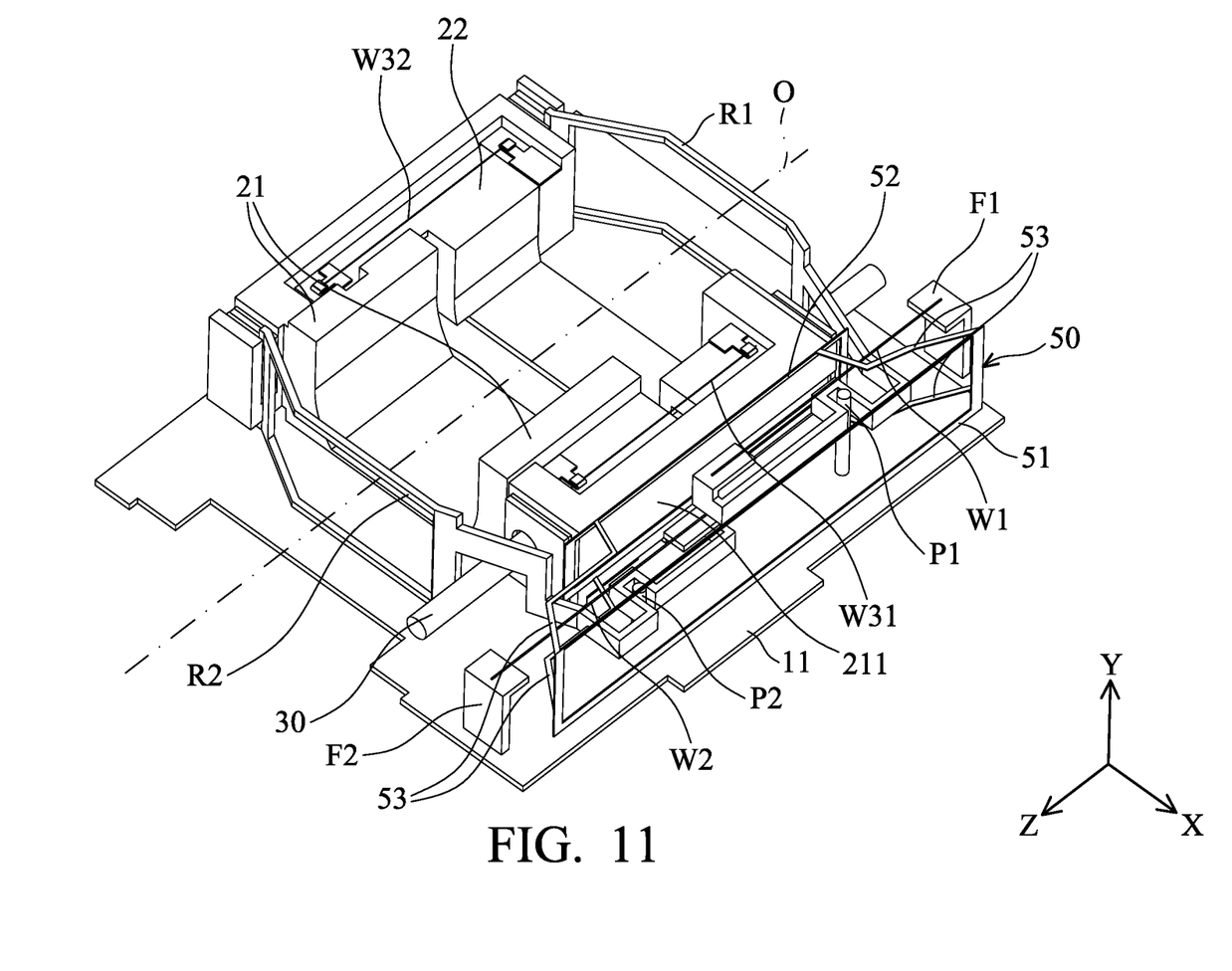
FIG. 11 is a perspective diagram of a driving mechanism that has a circuit unit 50, in accordance with another embodiment of the invention.
Figure 12:
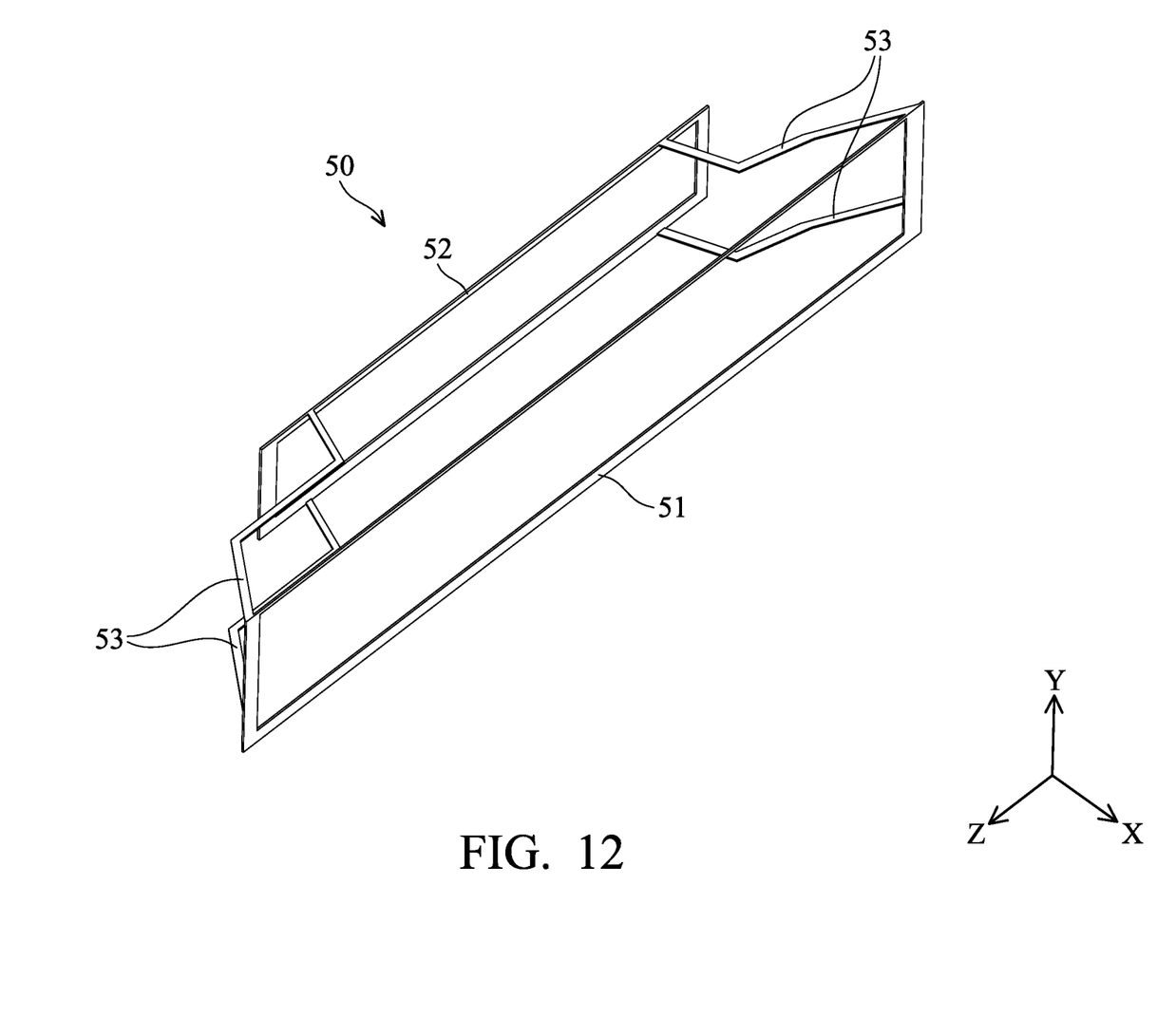
FIG. 12 is a perspective diagram of the circuit unit 50 in FIG. 11.

FIG. 11 is a perspective diagram of a driving mechanism that has a circuit unit 50, in accordance with another embodiment of the invention. FIG. 12 is a perspective diagram of the circuit unit 50 in FIG. 11.

Referring to FIGS. 11 and 12, the circuit unit 50 can replace the circuit unit 40 in FIGS. 1-6. In this embodiment, the circuit unit 50 may be a metal truss that comprises a rectangular outer frame 51, a rectangular inner frame 52, and four rods 53 connected between the outer and inner frames 51 and 52. The outer frame 51 is affixed to the sidewall 13 of the fixed part 10, and the inner frame 52 can slide and contact a conductive terminal (not shown) on the lateral side 211 of the first slider 21. When the first slider 21 moves along the Z axis relative to the bottom plate 11, the inner frame 52 remains in contact with the conductive terminal.

Therefore, the third wires W31 and W32 can be electrically connected to the circuit structure on the bottom plate 11 through the circuit unit 50 and the metal traces formed on the first slider 21.

In summary, the invention provides a driving mechanism that includes the first and second connecting members R1, R2 and the wires W1, W2, W31, and W32, wherein the wires W1, W2, W31, and W32 comprise Shape Memory Alloy (SMA) material. By applying principle of leverage, the first and second sliders 21 and 22 and the optical elements disposed thereon can be impelled in a direction parallel to the optical axis O by the first and second connecting members R1, R2, thus improving efficiency of the driving mechanism and facilitating miniaturization of the product.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A driving mechanism for moving an optical element, comprising:
    a fixed part;
    a movable part, connected to the fixed part, wherein the optical element is disposed on the movable part;
    a first connecting member, having a free end and a connection end connected to the movable part;
    a hinge, pivotally connecting the first connecting member to the fixed part; and
    a first wire, comprising Shape Memory Alloy (SMA) material and connecting the free end to the fixed part;
    wherein in a case that the first wire contracts in length, the first connecting member is forced to rotate relative to the fixed part around the hinge, and the movable part is forced to move relative to the fixed part in a first direction;
    wherein the fixed part has a bottom plate, the first connecting member and the hinge comprise metal, and the first wire is electrically connected to a circuit structure on the bottom plate via the first connecting member and the hinge.

2. The driving mechanism as claimed in claim 1, wherein the distance between the first wire and the hinge is shorter than the distance between the connection end and the hinge.

3. The driving mechanism as claimed in claim 1, further comprising a shaft extending through the movable part and connecting to the fixed part, wherein in a case that the first wire contracts in length, the first connecting member rotates relative to the fixed part and forces the movable part to slide along the shaft.

4. The driving mechanism as claimed in claim 3, wherein the shaft is parallel to an optical axis of the optical element.

5. The driving mechanism as claimed in claim 4, wherein the first wire is located between the hinge and the connection end along a first axis that is perpendicular to the optical axis.

6. The driving mechanism as claimed in claim 5, wherein the first wire is located between the hinge and the shaft along the first axis.

7. The driving mechanism as claimed in claim 1, wherein the first connecting member further has a pivot portion for receiving the hinge, a resistance arm connected between the pivot portion and the connection end, and an effort arm connected between the pivot portion and the free end, wherein the resistance arm is longer than the effort arm.

8. The driving mechanism as claimed in claim 7, wherein the resistance arm has a C-shaped or U-shaped structure.

9. The driving mechanism as claimed in claim 7, wherein the resistance arm forms a hole, and an optical axis of the optical element extends through the hole.

10. The driving mechanism as claimed in claim 1, further comprising a second connecting member and a second wire, wherein the second connecting member is hinged on the fixed part, and the second wire comprises Shape Memory Alloy (SMA) material and connects the second connecting member to the fixed part, wherein in a case that the second wire contracts in length, the second connecting member is forced to rotate relative to the fixed part, and the movable part is forced to move relative to the fixed part in a second direction opposite to the first direction.

11. The driving mechanism as claimed in claim 10, wherein when viewed along a second axis that is perpendicular to an optical axis of the optical element, the first and second connecting members partially overlap.

12. The driving mechanism as claimed in claim 10, wherein the movable part includes a first slider and a second slider, and the driving mechanism further comprises a third wire connecting to the first and second sliders, wherein in a case that the third wire contracts in length, the first slider is forced to move relative to the second slider.

13. The driving mechanism as claimed in claim 12, wherein the driving mechanism further comprises two third wires connected between the first and second sliders for driving the first slider to move relative to the second slider either in the first direction or in the second direction.

14. The driving mechanism as claimed in claim 1, wherein the driving mechanism further comprises a circuit unit disposed on the fixed part, and the circuit unit has a base portion, a side portion, and a bent portion, wherein the base portion is connected to the fixed part, the side portion connects the base portion to the bent portion, and the side portion and the bent portion are perpendicular to the base portion.

15. The driving mechanism as claimed in claim 14, wherein the bent portion has an L-shaped structure connected between the side portion and the movable part.

16. The driving mechanism as claimed in claim 14, wherein the driving mechanism further comprises a magnet disposed on the movable part and a Hall effect sensor disposed on the base portion of the circuit unit for sensing the magnet.

17. The driving mechanism as claimed in claim 14, wherein the bent portion contacts a conductive terminal on the movable part for electrically connecting to the first wire.

18. The driving mechanism as claimed in claim 14, wherein an opening is formed between the base portion and the side portion, and the hinge extends through the opening.

19. A driving mechanism for moving an optical element, comprising:
- a fixed part;
- a movable part, connected to the fixed part, wherein the optical element is disposed on the movable part;
- a circuit unit, disposed on the fixed part, wherein the circuit unit has an outer frame, an inner frame, and a plurality of rods connected between the outer and inner frames;
- a first connecting member, having a free end and a connection end connected to the movable part;
- a hinge, pivotally connecting the first connecting member to the fixed part; and
- a first wire, comprising Shape Memory Alloy (SMA) material and connecting the free end to the fixed part;
- wherein in a case that the first wire contracts in length, the first connecting member is forced to rotate relative to the fixed part around the hinge, and the movable part is forced to move relative to the fixed part in a first direction;
- wherein the outer frame is connected to the fixed part, and the inner frame contacts a conductive terminal on the movable part for electrically connecting to the first wire.

* * * * *